United States Patent
Muramatsu

(10) Patent No.: US 7,642,151 B2
(45) Date of Patent: Jan. 5, 2010

(54) SEMICONDUCTOR DEVICE AND METHOD OF MANUFACTURING THE SAME

(75) Inventor: Satoru Muramatsu, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/285,414

(22) Filed: Oct. 3, 2008

(65) Prior Publication Data
US 2009/0047767 A1 Feb. 19, 2009

Related U.S. Application Data

(62) Division of application No. 11/708,068, filed on Feb. 20, 2007.

(30) Foreign Application Priority Data
Feb. 21, 2006 (JP) .............................. 2006-043418

(51) Int. Cl.
*H01L 21/8238* (2006.01)
(52) U.S. Cl. .................... 438/219; 438/221; 438/294
(58) Field of Classification Search ................ 438/219, 438/221, 294
See application file for complete search history.

(56) References Cited

U.S. PATENT DOCUMENTS 6,121,100 A 9/2000 Andideh et al.
6,429,061 B1 8/2002 Rim
2005/0285187 A1 12/2005 Bryant et al.

FOREIGN PATENT DOCUMENTS

| CN | 1348210 A | 5/2002 |
|---|---|---|
| CN | 1534744 | 10/2004 |
| JP | 10-284722 | 10/1998 |

OTHER PUBLICATIONS

Chinese Office Action dated Jan. 23, 2009 with English-Language Translation.
Chinese Office Action dated Jul. 4, 2008, with English translation.

*Primary Examiner*—Douglas M Menz
(74) *Attorney, Agent, or Firm*—McGinn IP Law Group, PLLC

(57) ABSTRACT

A semiconductor device includes a silicon substrate, a strain-inducing layer, a silicon layer, a FET, and an isolation region. On the silicon substrate, the strain-inducing layer is provided. On the strain-inducing layer, the silicon layer is provided. The strain-inducing layer induces lattice strain in a channel region of the FET in the silicon layer. The silicon layer includes the FET. The FET includes a source/drain region, an SD extension region, a gate electrode and a sidewall. The source/drain region and the strain-inducing layer are spaced from each other. Around the FET, the isolation region is provided. The isolation region penetrates the silicon layer so as to reach the strain-inducing layer.

3 Claims, 10 Drawing Sheets

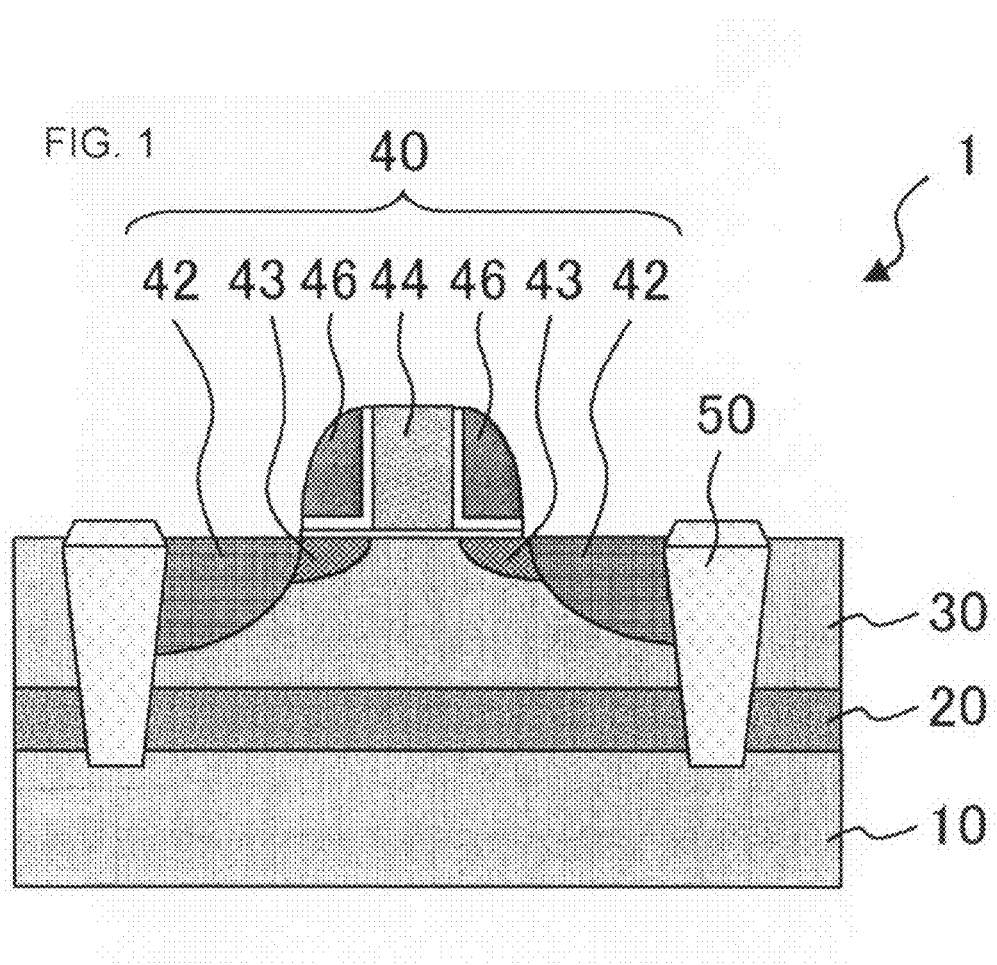

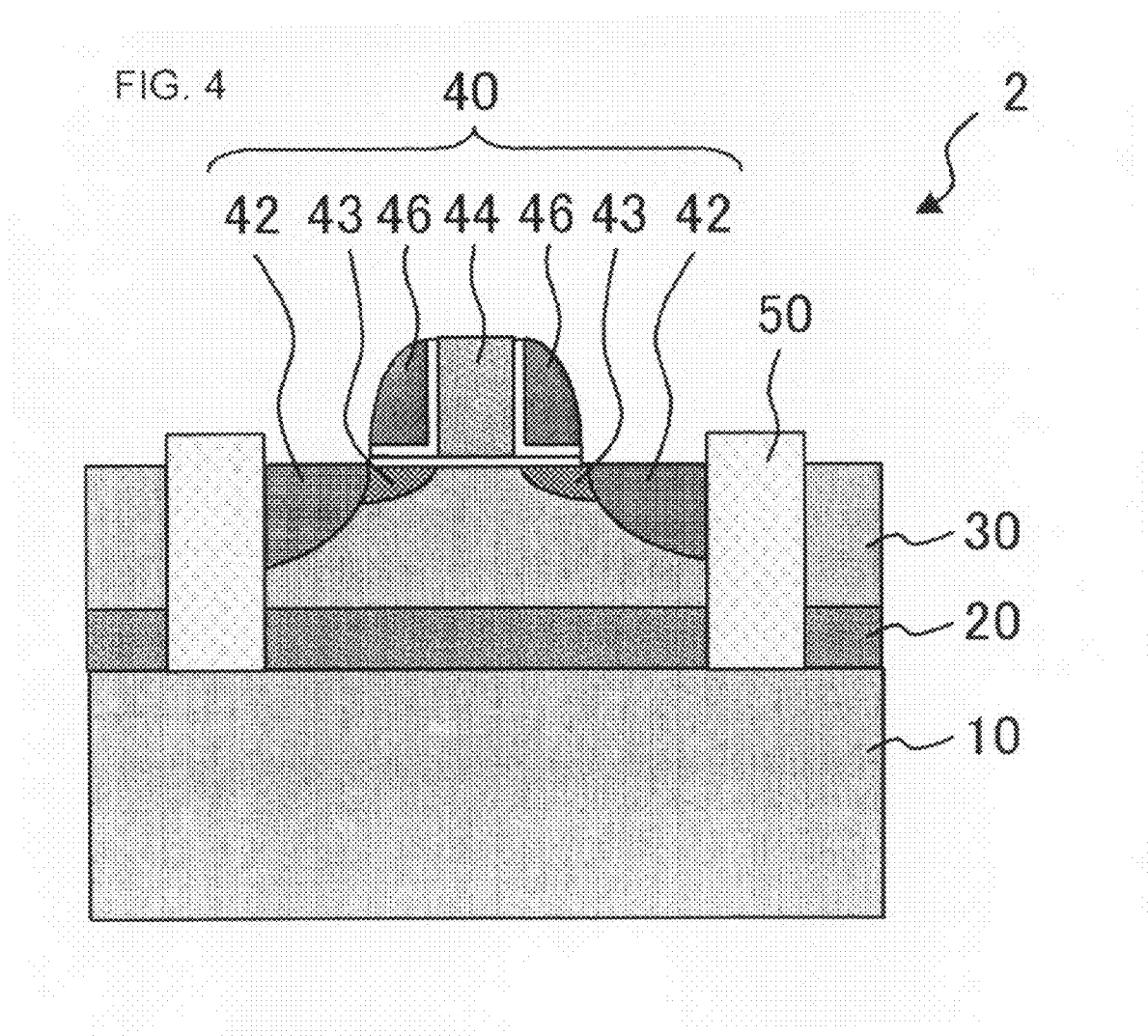

PRIOR ART

PRIOR ART

PRIOR ART

PRIOR ART

SEMICONDUCTOR DEVICE AND METHOD OF MANUFACTURING THE SAME

This application is based on Japanese patent application No. 2006-043418, the content of which is incorporated hereinto by reference.

The present Application is a Divisional Application of U.S. patent application Ser. No. 11/708,068, filed on Feb. 20, 2007.

BACKGROUND

1. Technical Field

The present invention relates to a semiconductor device and a method of manufacturing the same.

2. Related Art

FIG. 7 is a cross-sectional view showing a conventional semiconductor device. In the semiconductor device 100, a SiGe epitaxial layer 102 and a silicon epitaxial layer 103 are sequentially stacked on a silicon substrate 101. The silicon epitaxial layer 103 includes a field effect transistor (hereinafter, FET) 110 constituted of a source/drain region 111, a gate electrode 112 and so forth. The FET 110 is isolated from other elements by a shallow trench isolation (hereinafter, STI) 104 formed around the FET 110.

Techniques related to the present invention are disclosed, for example, in Japanese Laid-open patent publication No. H10-284722 (patent document 1) and U.S. Pat. No. 6,121,100 Specification (patent document 2).

SUMMARY OF THE INVENTION

In the semiconductor device 100, the SiGe epitaxial layer 102 applies biaxial stress to the silicon epitaxial layer 103, thereby inducing lattice strain in the silicon epitaxial layer 103. Thus, when manufacturing the semiconductor device 100, a so-called "strained silicon process" is employed. The wafer fabricated through such process is called a "strained silicon wafer". Employing the strained silicon wafer leads to a significant increase in carrier mobility in the FET.

The semiconductor device 100 thus configured, however, has a drawback that the silicon epitaxial layer 103 is prone to incur crystal lattice defects (dislocation). In FIG. 7, lines L1 schematically indicate the emergence of the crystal lattice defects. A reason that the crystal lattice defects emerge is considered as follows. The strained silicon wafer attempts to warp so as to relieve the stress between the SiGe epitaxial layer 102 and the silicon epitaxial layer 103. Under such state, the wafer is exposed to an excessive force during a process such as vacuum chucking, to thereby incur the crystal lattice defects. The crystal lattice defects provoke degradation in electrical characteristics of the semiconductor device, for example an increase in leak current.

According to the present invention, there is provided a semiconductor device including: a silicon substrate; a strain-inducing layer provided on the silicon substrate; a silicon layer provided on the strain-inducing layer; a field effect transistor provided in the silicon layer; and an isolation region provided around the field effect transistor, and penetrating the silicon layer so as to reach the strain-inducing layer; wherein the strain-inducing layer is spaced from a source/drain region of the field effect transistor, and induces strain in a channel portion of the field effect transistor in the silicon layer.

In the semiconductor device thus constructed, the strain-inducing layer induces lattice strain in the channel portion of the FET in the silicon layer. Such structure provides significantly increased carrier mobility in the FET, thereby upgrading the electrical characteristics of the FET, hence the semiconductor device. Also, the isolation region penetrates the silicon layer so as to reach the strain-inducing layer. Accordingly, in the manufacturing process of the semiconductor device, the warp of the silicon wafer only takes place in each region delimited by the isolation region. In other words, the silicon wafer is prevented from largely bending as a whole. As a result, emergence of the crystal lattice defects in the silicon layer can be suppressed.

According to the present invention, there is also provided a method of manufacturing a semiconductor device that includes a field effect transistor, including: forming an isolation region on a silicon substrate so as to surround a region where the field effect transistor is to be formed; epitaxially growing a strain-inducing layer on the silicon substrate on which the isolation region is formed; epitaxially growing a silicon layer on the strain-inducing layer; and forming the field effect transistor in the silicon layer so that a source/drain region is spaced from the strain-inducing layer; wherein the strain-inducing layer induces strain in a channel portion of the field effect transistor in the silicon layer.

By the manufacturing method thus arranged, the silicon layer is formed on the strain-inducing layer. Therefore, in the semiconductor device manufactured according to the method, the strain-inducing layer induces lattice strain in the channel portion of the FET in the silicon layer. Such arrangement provides significantly increased carrier mobility in the FET, thereby upgrading the electrical characteristics of the FET, hence the semiconductor device. Also, the strain-inducing layer and the silicon layer are formed after forming the isolation region on the silicon substrate. Accordingly, the warp of the silicon wafer only takes place in each region delimited by the isolation region. In other words, the silicon wafer is prevented from largely bending as a whole. As a result, emergence of the crystal lattice defects in the silicon layer can be suppressed.

Thus, the present invention provides a semiconductor device that offers superior electrical characteristics, and a method of manufacturing such semiconductor device.

BRIEF DESCRIPTION OF THE DRAWINGS

The above and other objects, advantages and features of the present invention will be more apparent from the following description taken in conjunction with the accompanying drawings, in which:

FIG. 1 is a cross-sectional view showing a semiconductor device according to the first embodiment of the present invention;

FIG. 4 is a cross-sectional view showing a semiconductor device according to the second embodiment of the present invention;

DETAILED DESCRIPTION

Figure 2A:
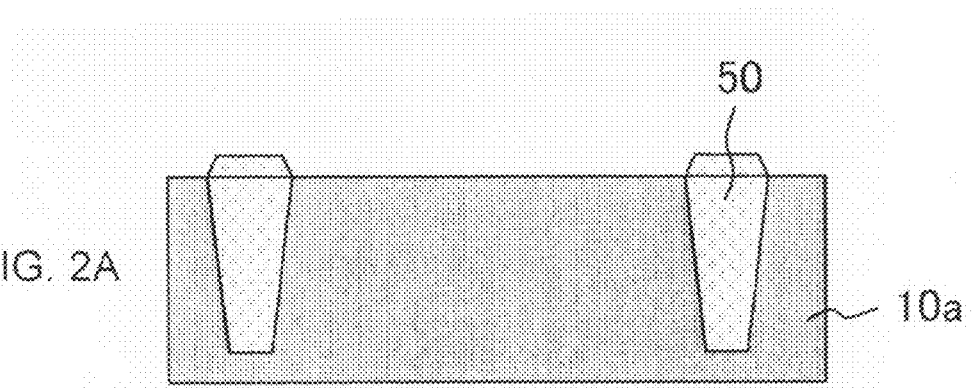
FIGS. 2A and 2B are cross-sectional views sequentially showing a method of manufacturing the semiconductor device according to the first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a semiconductor device and a method of manufacturing the same according to the present invention will be described in details, referring to the accompanying drawings. In the drawings, same constituents are given the same numerals, and the description thereof will not be repeated.

First Embodiment

FIG. 1 is a cross-sectional view showing a semiconductor device according to the first embodiment of the present invention. The semiconductor device 1 includes a silicon substrate 10, a strain-inducing layer 20, a silicon layer 30, a FET 40, and an isolation region 50.

On the silicon substrate 10, the strain-inducing layer 20 is provided. In this embodiment, the strain-inducing layer 20 is a SiGe layer. On the strain-inducing layer 20, the silicon layer 30 is provided. The strain-inducing layer 20 and the silicon layer 30 are epitaxial layers formed through an epitaxial growth. The strain-inducing layer 20 applies biaxial stress to the silicon layer 30, thereby inducing lattice strain in a channel region of the FET 40 in the silicon layer 30. The biaxial stress is parallel to the interface between the strain-inducing layer 20 and the silicon layer 30.

The silicon layer 30 includes therein the FET 40. The FET 40 includes a source/drain region 42, an SD extension region (Lightly Doped Drain (LDD) region) 43, a gate electrode 44 and a sidewall 46. Here, the source/drain region 42 and the strain-inducing layer 20 are spaced from each other.

The FET 40 may be either an N-channel type FET or a P-channel type FET. Although FIG. 1 shows a single FET (FET 40), the semiconductor device 1 may include both of the N-channel type FET and the P-channel type FET. In that case, those FETs are isolated from each other by the isolation region 50, which will be described below.

The isolation region 50 is provided around the FET 40. The isolation region 50 penetrates the silicon layer 30 so as to reach the strain-inducing layer 20. In this embodiment in particular, the isolation region 50 penetrates the silicon layer 30 and the strain-inducing layer 20 so as to reach an inner portion of the silicon substrate 10. The isolation region 50 may be a STI. As is apparent from FIG. 1, the strain-inducing layer 20 has a generally uniform thickness in the region surrounded by the isolation region 50.

Referring now to FIGS. 2A to 3B, a method of manufacturing the semiconductor device 1 will be described, as the first embodiment of the method of manufacturing a semiconductor device according to the present invention. In short, the method of manufacturing includes the following steps (a) to (d).

(a) Forming the isolation region 50 on the silicon substrate 10, so as to surround a region where the FET 40 is to be formed;

(b) Epitaxially growing the strain-inducing layer 20 on the silicon substrate 10 on which the isolation region 50 is formed;

(c) Epitaxially growing the silicon layer 30 on the strain-inducing layer 20; and (d) Forming the FET 40 in the silicon layer 30 so that the source/drain region 42 is spaced from the strain-inducing layer 20.

Figure 2B:
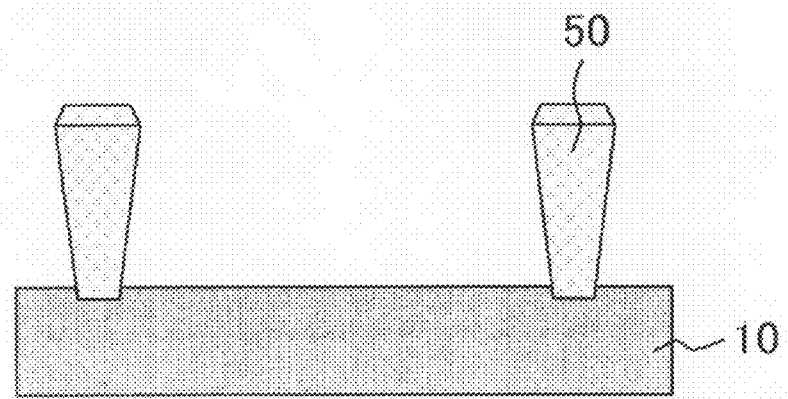

To be more detailed, firstly the isolation region 50 of a shallow trench structure is formed in a silicon substrate 10a (FIG. 2A). Then a dry etching process is performed so as to reduce the thickness of the silicon substrate 10a, thereby causing the silicon substrate 10a to retreat with respect to the isolation region 50 (FIG. 2B). At this stage, a portion of the isolation region 50 is to remain buried in the silicon substrate 10a. As a result, the isolation region 50 is formed on the silicon substrate 10, so as to surround the region where the FET 40 is to be formed.

That is, when forming the isolation region 50, the isolation region 50 is formed in a surface layer of the silicon substrate 10a, and then the silicon substrate 10a is made thinner from the side of the surface layer.

Figure 3A:
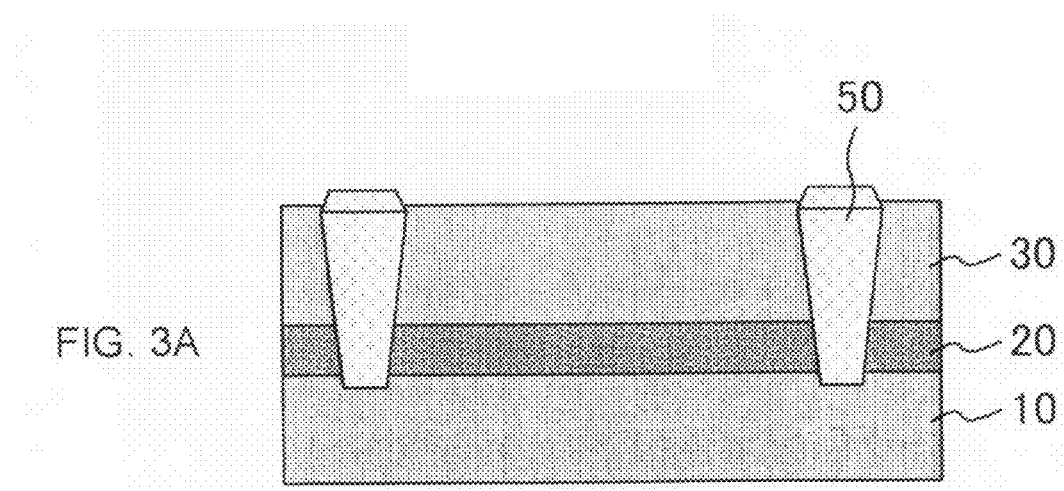
FIGS. 3A and 3B are cross-sectional views sequentially showing a method of manufacturing the semiconductor device according to the first embodiment.
Figure 3B:
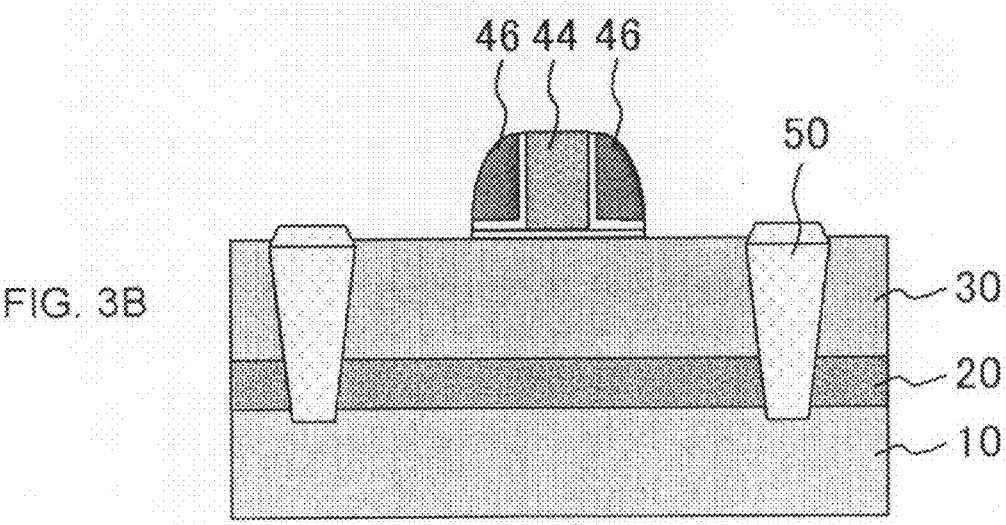

After epitaxially growing the strain-inducing layer 20 on the silicon substrate 10, the silicon layer 30 is formed by epitaxial growth on the strain-inducing layer 20 (FIG. 3A). The gate electrode 44 and the sidewall 46 are then formed on the silicon layer 30 (FIG. 3B). Further, the source/drain region 42 and the SD extension region 43 are formed in the silicon layer 30, so that the semiconductor device 1 shown in FIG. 1 is obtained.

This embodiment provides the following advantageous effects. In the foregoing manufacturing method, the silicon layer 30 is formed on the strain-inducing layer 20. Accordingly, in the semiconductor device 1, the strain-inducing layer 20 induces lattice strain in the channel portion of the FET 40 in the silicon layer 30. Such arrangement provides significantly increased carrier mobility in the FET 40, thereby upgrading the electrical characteristics of the FET 40, hence the semiconductor device 1.

Also, the isolation region 50 penetrates the silicon layer 30 so as to reach the strain-inducing layer 20. Accordingly, in the manufacturing process of the semiconductor device 1, the warp of the silicon wafer only takes place in each region delimited by the isolation region 50. In other words, the silicon wafer is prevented from largely bending as a whole. As a result, emergence of the crystal lattice defects in the silicon layer 30 can be suppressed. Thus, the foregoing embodiment provides the semiconductor device 1 that offers superior electrical characteristics, and the manufacturing method thereof.

The strain-inducing layer 20 is constituted of the SiGe layer. The SiGe layer has properties appropriate for acting as the layer that induces the lattice strain in the channel portion of the FET 40.

The isolation region 50 penetrates the silicon layer 30 and the strain-inducing layer 20 so as to reach the silicon substrate 10. Accordingly, the strain-inducing layer 20 is completely split by the isolation region 50. Such structure further ensures the prevention of the foregoing problem of the significant warp of the silicon wafer as a whole. Especially in this embodiment, the isolation region 50 reaches as far as an inner portion of the silicon substrate 10. Such structure even further assures the prevention of the foregoing problem.

In the formation process of the isolation region 50, the isolation region 50 is formed in the surface layer of the silicon substrate 10a, and then the silicon substrate 10a is made thinner from the side of the surface layer. Such method easily achieves the structure in which the isolation region 50 reaches as far as an inner portion of the silicon substrate 10.

In the region surrounded by the isolation region 50, the strain-inducing layer 20 has a generally uniform thickness. Such structure facilitates the strain-inducing layer 20 to properly apply the biaxial stress to the silicon layer 30.

In the case where both of the N-channel type FET and the P-channel type FET are provided in the semiconductor device 1, this embodiment provides an even greater advantage. This is because, when the biaxial stress is applied to the silicon layer 30, the increase in carrier mobility can be achieved in both of the N-channel type FET and the P-channel type FET, unlike the case that a uniaxial stress is applied.

Figure 7:
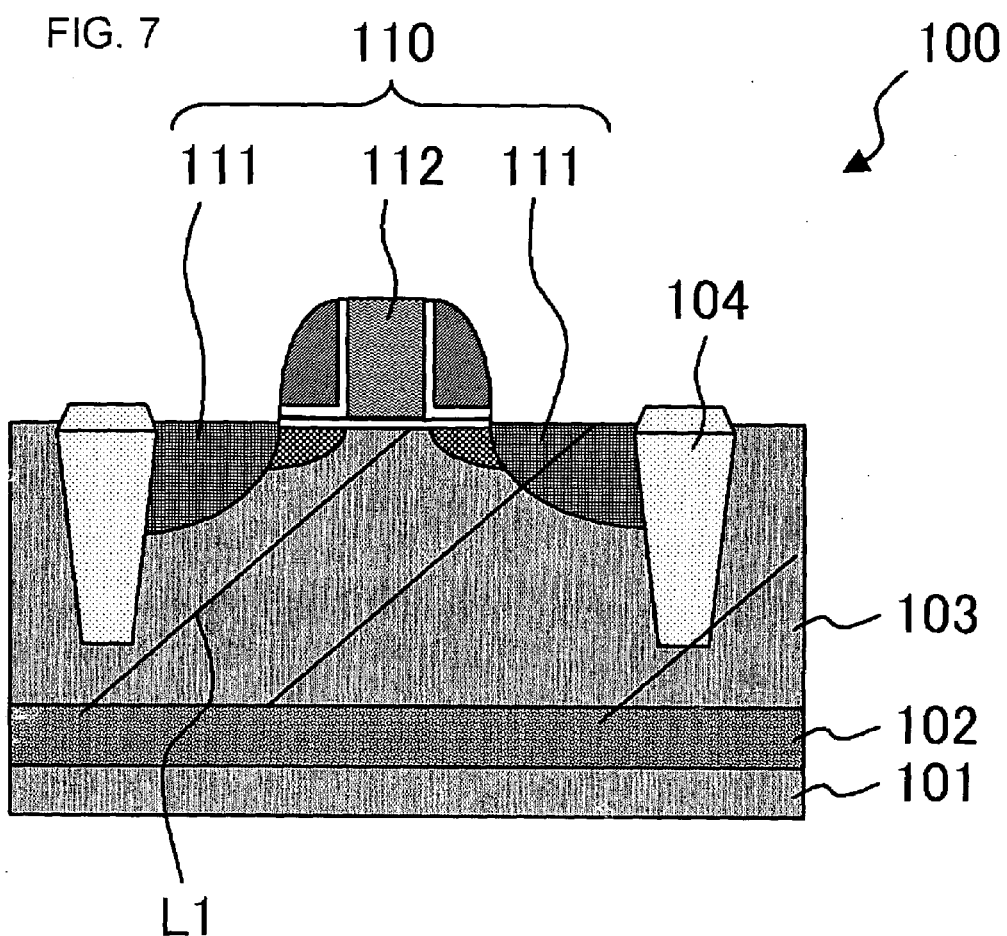
FIG. 7 is a cross-sectional view showing a conventional semiconductor device.
Figure 8:
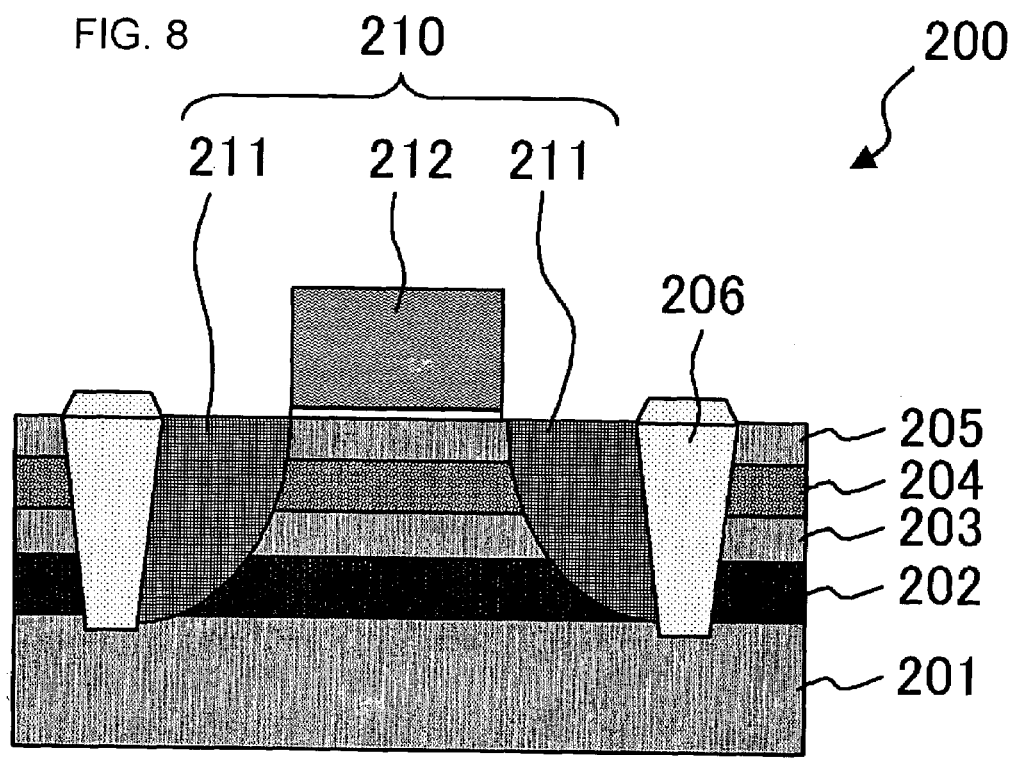
FIG. 8 is a cross-sectional view showing a semiconductor device according to the patent document 1.
Figure 9:
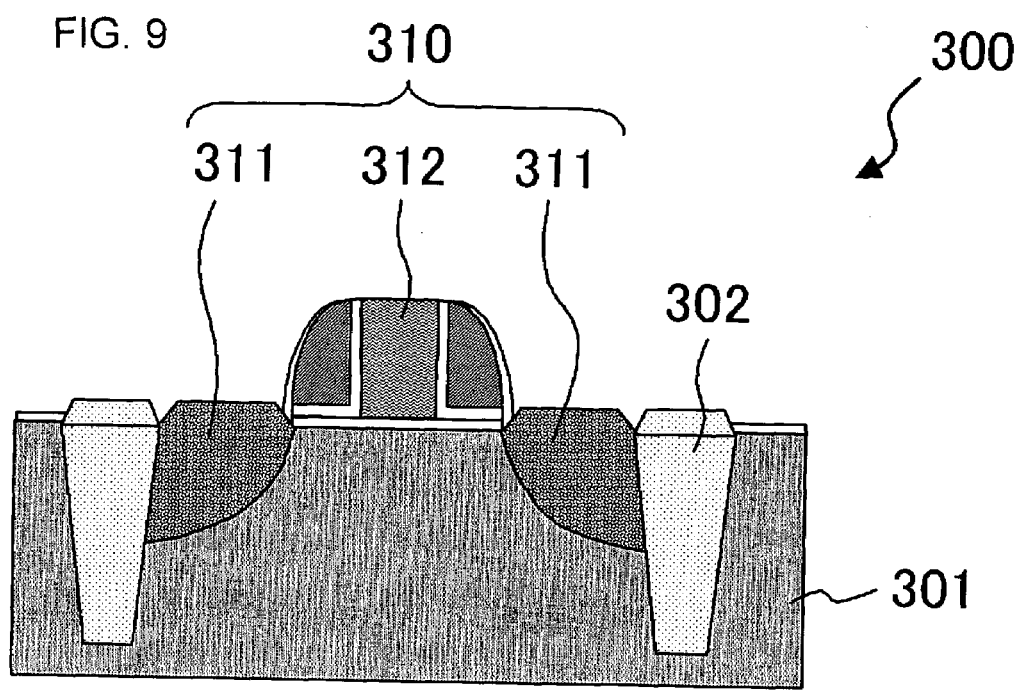
FIG. 9 is a cross-sectional view showing a semiconductor device according to the patent document 2.

Meanwhile, the conventional semiconductor devices include those shown in FIGS. 8 and 9, in addition to the one shown in FIG. 7.

FIG. 8 is a cross-sectional view showing a semiconductor device according to the patent document 1. The semiconductor device 200 includes a silicon epitaxial layer 202 doped with boron, a silicon epitaxial layer 203, a SiGe epitaxial layer 204 and a silicon epitaxial layer 205, sequentially stacked on a silicon substrate 201. Also, a source/drain region 211 is provided through the four layers, namely the silicon epitaxial layer 202, the silicon epitaxial layer 203, the SiGe epitaxial layer 204 and the silicon epitaxial layer 205. The source/drain region 211 constitutes a FET 210 together with a gate electrode 212. Around the FET 210, a STI 206 is formed.

Thus, in the semiconductor device 200, the source/drain region 211 is located in the SiGe epitaxial layer 204. An intent of such structure is based on the fact that the SiGe layer offers higher hole carrier mobility than the silicon layer. In other words, the SiGe layer is utilized as a migration path of the hole carrier, to thereby improve the electrical characteristics.

Now it will be assumed that, in the foregoing semiconductor device 1, the source/drain region 42 is located in the strain-inducing layer 20. In this case, the ion implantation performed for forming the source/drain region 42 relieves the stress in the strain-inducing layer 20. This naturally degrades the expected function of the strain-inducing layer 20 of applying the biaxial stress to the silicon layer 30. It is for such reason that in the semiconductor device 1 the strain-inducing layer 20 and the source/drain region 42 are spaced from each other.

FIG. 9 is a cross-sectional view showing a semiconductor device according to the patent document 2. In the semiconductor device 300, a P-channel type FET 310 constituted of a source/drain region 311, a gate electrode 312 and so on is provided on the silicon substrate 301. The source/drain region 311 is constituted of a SiGe epitaxial layer. Around the P-channel type FET 310, a STI 302 is formed.

Figure 10A:
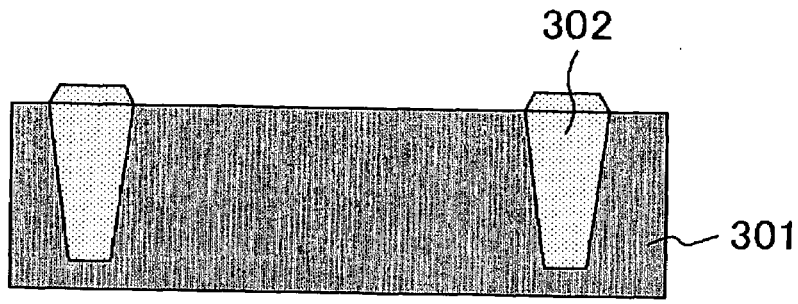
FIGS. 10A to 10C are cross-sectional views sequentially showing a method of manufacturing the semiconductor device shown in FIG. 9.
Figure 10B:
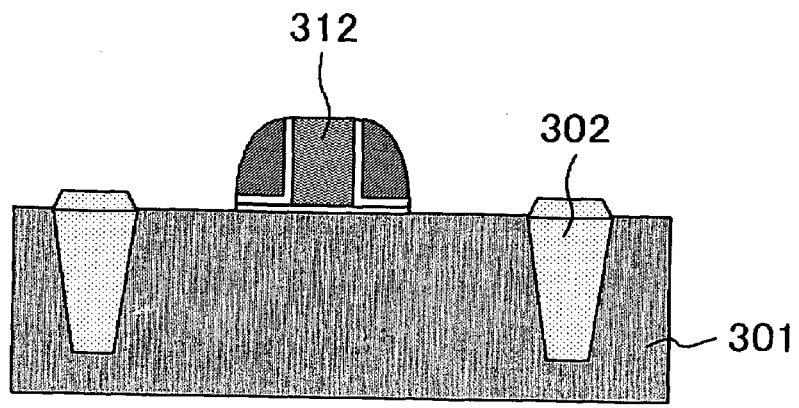
Figure 10C:
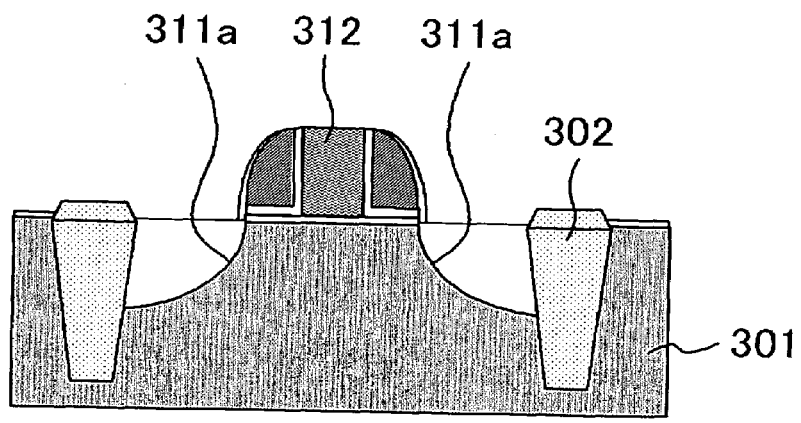

Referring to FIGS. 10A to 10C, a method of manufacturing the semiconductor device 300 will be described. Firstly, the STI 302 is formed in the silicon substrate 301 (FIG. 10A). Then the gate electrode 312 is formed on the silicon substrate 301 (FIG. 10B). An etching process is then performed on a region of the silicon substrate 301 where the source/drain region 311 is to be formed, to thereby form a recessed portion 311a (FIG. 10C). Finally the SiGe layer is epitaxially grown in the recessed portion 311a, so as to form the source/drain region 311. That is how the semiconductor device 300 shown in FIG. 9 can be obtained.

In the semiconductor device 300, the source/drain region 311 applies uniaxial stress to the silicon substrate 301. This does lead to upgraded electrical characteristics of the P-channel type FET 310. On the other hand, however, the uniaxial stress is not only unable to improve the electrical characteristics of the N-channel type FET, but even degrades the same. For such reason, when manufacturing the semiconductor device 300, the recessed portion 311a has to be etched on the region where the P-channel type FET is to be formed, with a mask provided on the region where the N-channel type FET is to be formed. This naturally leads to an increase in the number of manufacturing steps, hence to complication of the manufacturing process.

According to this embodiment, in contrast, since the strain-inducing layer 20 exerts the biaxial stress, the electrical characteristics of the N-channel type FET and the P-channel type FET can both be upgraded. Accordingly no increase in the number of manufacturing steps is incurred.

Second Embodiment

FIG. 4 is a cross-sectional view showing a semiconductor device according to the second embodiment of the present invention. The semiconductor device 2 includes the silicon substrate 10, the strain-inducing layer 20, the silicon layer 30, the FET 40, and the isolation region 50. The silicon substrate 10, the strain-inducing layer 20, the silicon layer 30 and the FET 40 are similarly constructed to those provided in the semiconductor device 1.

A difference between the semiconductor device 2 and the semiconductor device 1 lies in the structure of the isolation region 50. Specifically, in the semiconductor device 1 the isolation region 50 passes over the interface between the silicon substrate 10 and the strain-inducing layer 20, thus reaching as far as an inner portion of the silicon substrate 10. In contrast, an end portion of the isolation region 50 in the semiconductor device 2 is flush with the interface.

Figure 5A:
FIGS. 5A to 5C are cross-sectional views sequentially showing a method of manufacturing the semiconductor device according to the second embodiment.
Figure 5B:
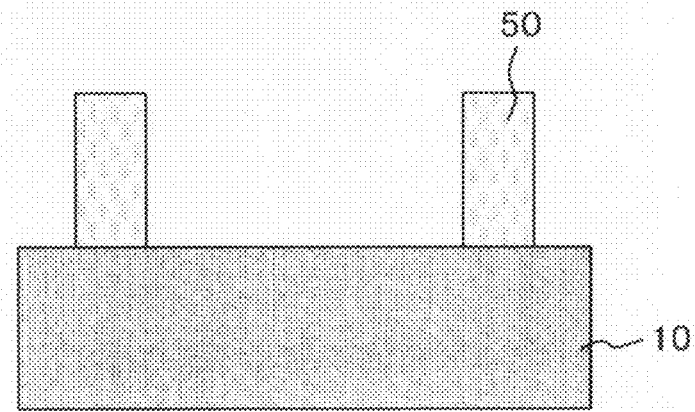
Figure 5C:
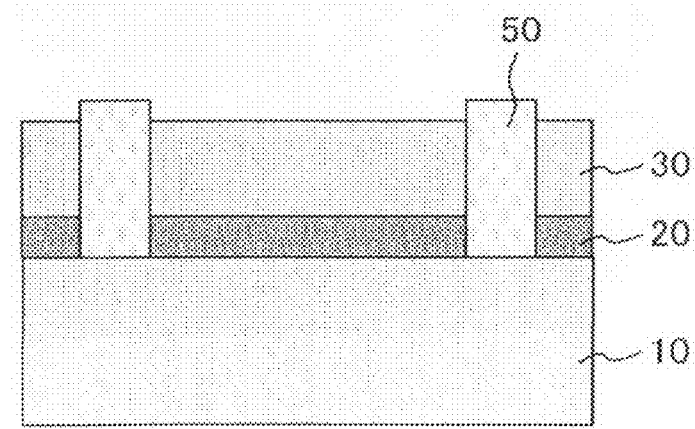

Referring to FIGS. 5A to 5C, a method of manufacturing the semiconductor device 2 will be described, as the second embodiment of the method of manufacturing a semiconductor device according to the present invention. The method also includes the foregoing steps (a) to (d) as in the first embodiment.

To be more detailed, firstly an insulating layer 50a is formed on the silicon substrate 10 (FIG. 5A). Then a photolithography process is performed so as to remove the insulating layer 50a, except for a portion that is to constitute the isolation region 50 (FIG. 5B). As a result, the isolation region 50 is formed on the silicon substrate 10, so as to surround the region where the FET 40 is to be formed.

That is, to form the isolation region 50, the insulating layer 50a is formed on the silicon substrate 10, and then patterned into the isolation region 50.

After epitaxially growing the strain-inducing layer 20 on the silicon substrate 10, the silicon layer 30 is formed by epitaxial growth on the strain-inducing layer 20 (FIG. 5C). Then the FET 40 is formed, so that the semiconductor device 2 shown in FIG. 4 is obtained.

This embodiment provides the following advantageous effects. In this embodiment also, the strain-inducing layer 20 induces lattice strain in the channel portion of the FET 40 in the silicon layer 30. Such arrangement provides significantly increased carrier mobility in the FET 40, thereby upgrading the electrical characteristics of the FET 40, hence the semiconductor device 1.

Also, the isolation region 50 penetrates the silicon layer 30 so as to reach the strain-inducing layer 20. Accordingly, in the manufacturing process of the semiconductor device 2, the warp of the silicon wafer only takes place in each region delimited by the isolation region 50. In other words, the silicon wafer is prevented from largely bending as a whole. As a result, emergence of the crystal lattice defects in the silicon layer 30 can be suppressed. Thus, the foregoing embodiment provides the semiconductor device 2 that offers superior electrical characteristics, and the manufacturing method thereof.

The isolation region 50 penetrates the silicon layer 30 and the strain-inducing layer 20 so as to reach the silicon substrate 10. Accordingly, the strain-inducing layer 20 is completely split by the isolation region 50. Such structure further ensures the prevention of the problem of the significant warp of the silicon wafer as a whole.

In the formation process of the isolation region 50, the insulating layer 50a is formed on the silicon substrate 10, and then patterned into the isolation region 50. Such method easily achieves the structure in which the isolation region 50 reaches the silicon substrate 10. In addition, the advantages offered by the first embodiment can also be attained by this embodiment.

Figure 6A:
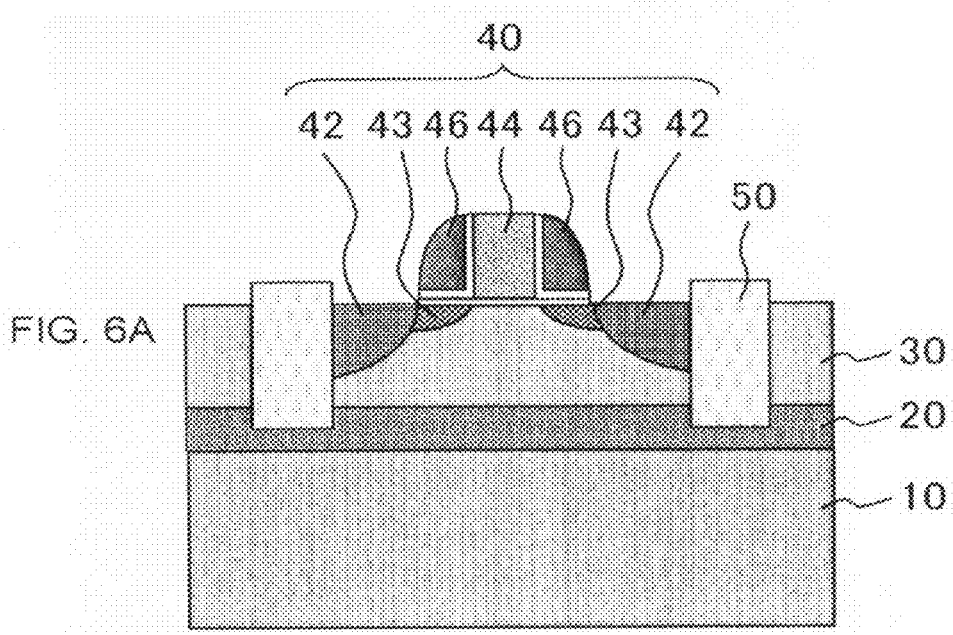
FIGS. 6A and 6B are cross-sectional views showing semiconductor devices according to variations of the embodiments.
Figure 6B:
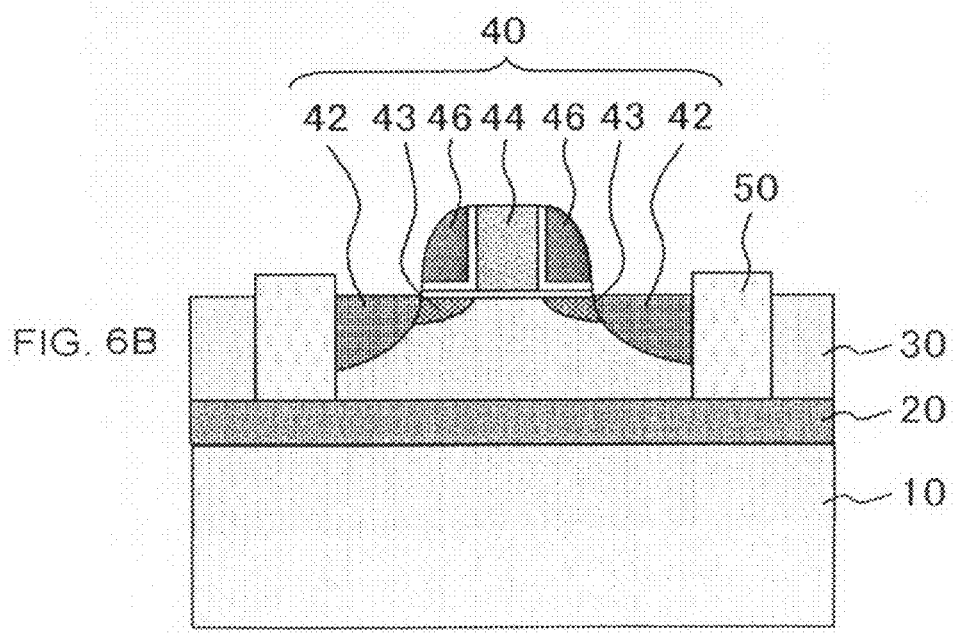

The semiconductor device and the manufacturing method thereof according to the present invention are not limited to the foregoing embodiments, but various modifications may be made. To cite a few examples, although the isolation region 50 is provided so as to penetrate the strain-inducing layer 20 in the embodiments, it is not mandatory that the isolation region 50 penetrates the strain-inducing layer 20, but it suffices that the isolation region 50 reaches the strain-inducing layer 20. An end portion of the isolation region 50 may be located inside the strain-inducing layer 20 as shown in FIG. 6A, or flush with the interface between the strain-inducing layer 20 and the silicon layer 30, as shown in FIG. 6B.

The material of the strain-inducing layer 20 is not limited to the SiGe. Other materials may be employed, as long as the material is capable of inducing the lattice strain in the channel portion of the FET 40.

Further, although only the biaxial stress is utilized in the foregoing embodiments, the biaxial stress and the uniaxial stress may be utilized in combination. In that case, for example the source/drain region 42 may be constituted as a SiGe epitaxial layer, in the semiconductor device 1 or the semiconductor device 2.

It is apparent that the present invention is not limited to the above embodiment, and may be modified and changed without departing from the scope and spirit of the invention.

What is claimed is:

1. A method of manufacturing a semiconductor device that includes a field effect transistor, comprising:
   forming an isolation region on a silicon substrate so as to surround a region where said field effect transistor is to be formed;
   epitaxially growing a strain-inducing layer on said silicon substrate on which said isolation region is formed;
   epitaxially growing a silicon layer on said strain-inducing layer; and
   forming said field effect transistor in said silicon layer so that a source/drain region is spaced from said strain-inducing layer;
   wherein said strain-inducing layer induces strain in a channel portion of said field effect transistor in said silicon layer.

2. The method according to claim 1, wherein said forming of said isolation region includes forming said isolation region in a surface layer of said silicon substrate, and then reducing a thickness of said silicon substrate from a side of said surface layer.

3. The method according to claim 1, wherein said forming of said isolation region includes forming an insulating layer on said silicon substrate, and then patterning said insulating layer into said isolation region.

* * * * *